United States Patent [19]

Momodomi

[11] Patent Number: 4,751,676
[45] Date of Patent: Jun. 14, 1988

[54] SEMICONDUCTOR INTEGRATED CIRCUITS

[75] Inventor: Masaki Momodomi, Yokohama, Japan

[73] Assignee: Kabushiki Kaisha Toshiba, Kawasaki, Japan

[21] Appl. No.: 911,799

[22] Filed: Sep. 26, 1986

[30] Foreign Application Priority Data

Sep. 30, 1985 [JP] Japan .................................. 60-216456

[51] Int. Cl.$^4$ ............................................. G11C 13/00
[52] U.S. Cl. .................... 365/154; 365/149; 365/150
[58] Field of Search ............... 365/149, 154, 155, 156, 365/182, 189, 230, 150; 357/23.6, 45

[56] References Cited

U.S. PATENT DOCUMENTS 4,701,884 10/1987 Aoki et al. ......................... 365/189

Primary Examiner—Terrell W. Fears
Attorney, Agent, or Firm—Foley & Lardner, Schwartz, Jeffery, Schwaab, Mack, Blumenthal & Evans

[57] ABSTRACT

A semiconductor integrated circuit, comprises a semiconductor integrated circuit chip; a standard voltage generating means for generating standard voltage other than a supply voltage and a ground voltage, at least one, standard voltage wire for supplying the standard voltage to at least one circuit of said semiconductor integrated circuit chip; at least one first capacitor extending along the standard voltage wire, the first capacitor having the standard voltage wire as one electrode thereof, and the other electrode connected to the supply voltage; and at least one second capacitor extending along the standard voltage wire, the second capacitor having the standard voltage wire as one electrode thereof, and the other electrode connected to the ground voltage.

21 Claims, 8 Drawing Sheets

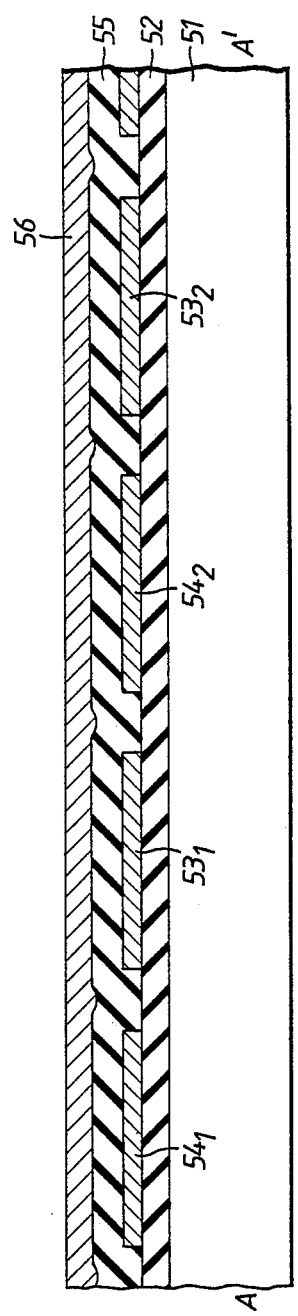
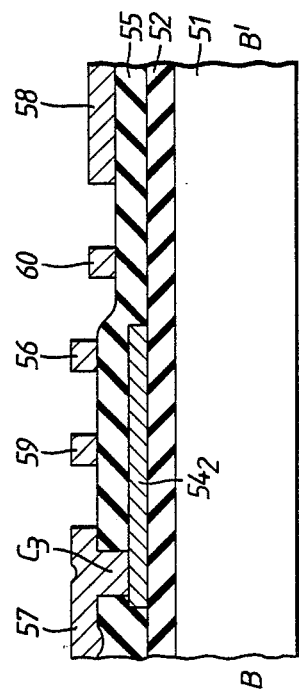
Fig.6a.
Fig.6b.

SEMICONDUCTOR INTEGRATED CIRCUITS

BACKGROUND OF THE INVENTION

The present invention relates to semiconductor integrated circuits having a standard voltage wire established at a standard voltage other than supply voltage and ground voltage.

Semiconductor integrated circuits, especially MOS dynamic RAMs, have progressed further and further to a high degree of integration and capacity. Consequently, the amount of electric charge for charging and discharging bit lines connected to memory cells has become quite large. Thus, the fluctuation of supply voltages $V_{cc}$ and $V_{ss}$, namely, power supply noise, has also increased, so that operation of various circuits suffer undesirable effects.

In reference to an address buffer circuit that is one of the sense circuits in an MOS dynamic RAM, the problems encountered may be illustrated in the following discussion taken together with FIG. 1.

FIG. 1 is an example of the conventional address buffer circuit. This address buffer circuit has, as its main elements, a first sense MOS transistor $Q_1$ and a second sense MOS transistor $Q_2$. The first MOS transistor $Q_1$ has a gate input from address signal $A_{in}$ which feeds thereto one of "H" or "L" voltage levels, and the second MOS transistor $Q_2$ has a gate input from a standard voltage $V_R$ intermediate "H" and "L" voltage levels.

The voltage levels at nodes $N_1$, $N_2$ of a flip-flop 1 consisting of MOS transistors $Q_3$ through $Q_6$ are determined in accordance with the difference of conductance between $Q_1$ and $Q_2$, which is brought about by the input noise difference described above. These levels are amplified with a first stage amplifier 2 consisting of MOS transistors $Q_7$ through $Q_{11}$, and then, amplified again with a second stage amplifier 3 comprising MOS transistors $Q_{12}$ through $Q_{15}$ and boosting capacitors C3 and C4. As a result, address output $\overline{A_N}$ and inverted output $\overline{A_N}$ are provided. MOS transistors $Q_{18}$ through $Q_{21}$, are transfer gates. The capacitor $C_1$ is an element for preventing undershooting, and capacitor $C_2$ is provided for balancing.

The standard voltage $V_R$ is generated by the resistance division network of resistors $R_1$ and $R_2$ connected in series between $V_{cc}$ and $V_{ss}$ as shown in FIG. 1. The number 4 denotes a standard voltage wire.

In the foregoing construction, the standard voltage $V_R$ is not usually generated nearby the sense MOS transistor $Q_2$ to which $V_R$ is input, but the standard voltage wire 4 is usually formed on the chip in a position remote from $Q_2$. Especially, in cases in which the same standard voltage $V_R$ is supplied to a plurality of circuits, the standard voltage wire 4 is extended to a relatively long length in relation to the chip component sizes. Moreover, the standard voltage wire 4 is connected at one end thereof to the electric potential provided by the resistance division network, and thus, the wire 4 is almost in a floating state.

As is common, when other signal wires are arranged adjoining the standard voltage wire 4, the potential of the standard voltage $V_R$ will fluctuate in accordance with the coupling capacitance generated by the close wires. Therefore, malfunction of the address buffer circuits is likely to occur. On the other hand, the potential fluctuation of $V_{ss}$ and $V_{cc}$ causes fluctuations of the substrate potential. These fluctuations produce further variations of the standard voltage $V_R$, and this variation of the power level also is likely to cause malfunction of the address buffer circuits.

SUMMARY OF THE INVENTION

Accordingly, an object of the invention is to provide an improved semiconductor integrated circuit having a standard voltage generation circuit.

Another object of the invention is to provide an improved semiconductor integrated circuit for accomplishing stable standard voltage.

Another object of the invention is to provide an improved semiconductor integrated circuit for preventing malfunction of same.

Another object of the invention is to provide an improved semiconductor integrated circuit for stabilizing a standard voltage against variations caused by signal wires adjoining a standard voltage wire.

Another object of the invention is to provide an improved semiconductor integrated circuit for stabilizing a standard voltage against potential fluctuations of the semiconductor substrate.

Still another object of the invention is to provide an improved semiconductor integrated circuit for stabilizing a standard voltage against voltage fluctuations of the supply voltage and ground voltage.

In accomplishing the foregoing objects, there has been provided according to one aspect of the invention a semiconductor integrated circuit, comprising: a semiconductor integrated circuit chip; a standard voltage generating means for generating a standard voltage other than the supply voltage and ground voltage, and being formed in the semiconductor integrated circuit chip at least one standard voltage wire for supplying said standard voltage to at least one circuit of said semiconductor integrated circuit chip; at least one first capacitor extending along the standard voltage wire, the first capacitor utilizing the standard voltage wire as one electrode, the other electrode thereof being connected to the supply voltage; and at least one second capacitor extending along the standard voltage wire as one electrode, with the other electrode thereof connected to the ground voltage.

BRIEF DESCRIPTION OF THE DRAWINGS

The invention, together with its various features and advantages, will be readily understood from the following more detailed description presented in conjunction with the following drawings, in which:

FIG. 6a is a diagram showing a cross sectional view along line A—A' of FIG. 5;

FIG. 6b is a diagram showing a cross sectional view along line B—B' of FIG. 5;

DETAILED DESCRIPTION OF THE PREFERRED EMBODIMENTS

Figure 2:
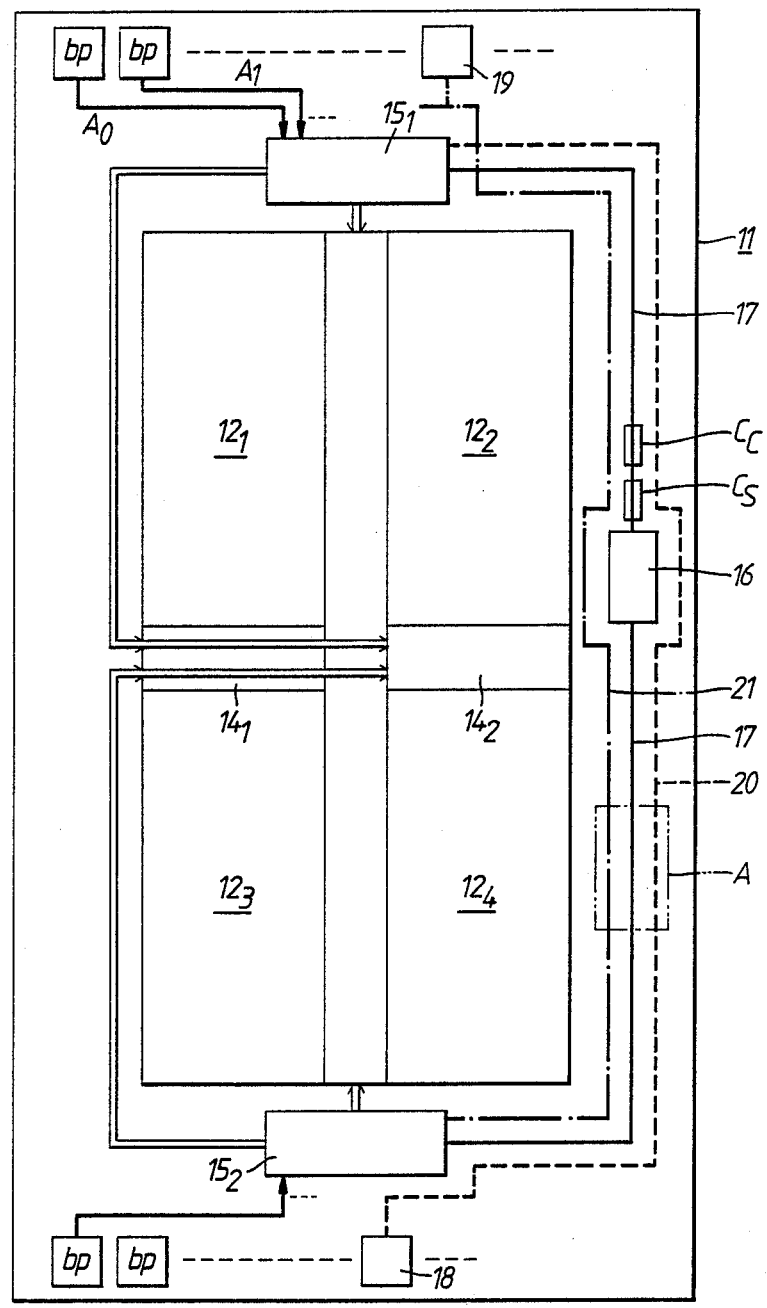
FIG. 2 is a diagram showing a plan view of a dynamic RAM chip to which the invention is applied.

FIG. 2 is a diagram showing a plan view of a dynamic RAM chip to which the present invention is applied.

In a dynamic RAM chip 11, four blocks of memory cell array regions $12_1$ through $12_4$ are formed. Conventional 1 Tr/1 capacitor cells are used. Between the memory cell array regions, a column address decoder 13 and row address decoders $14_1$, $14_2$ are inserted. A pair of address buffer regions $15_1$, $15_2$ are also provided.

Each of the address buffer regions $15_1$ and $15_2$ has a plurality of address buffer circuits for each of the columns and rows. Some of the address signals $A_0$, $A_1$, through $A_9$ are input to the address buffer region $15_1$ from upper bonding pads bp of the chip 11, and other address signals are input to the address buffer region $15_2$ from bonding pads of the bottom of the chip 11. The address buffer regions $15_1$, $15_2$ convert each of these address signals to a pair of complementary internal signals of $A_N$, $\overline{A_N}$. These internal signals are then supplied to the corresponding column or row decoders.

The input timing of the address signals of the column of the chip is different from that of the row. And, by means of the address signals received with the corresponding decoder 13 or decoders $14_1$, $14_2$, the desired column or row is selected.

The chip 11 has a standard voltage generating circuit (standard voltage generating means) 16, which generates 1.6 volts, and supplies it to the address buffer regions of $15_1$, $15_2$ and other circuits via standard voltage wires 17. The standard voltage wires 17 diverge near the output terminals of the standard voltage generating circuit 16 and run along both sides of the chip 11. The supply voltage $V_{cc}$ of 5 volts and ground voltage of 0 volt are supplied, respectively, from a supply voltage pad 18 and a ground voltage pad 19 formed on the chip. A supply voltage wire 20 and a ground voltage wire 21 run parallel and adjacent the standard voltage wires 17. Furthermore, along the standard voltage wires 17, $V_{cc}$ capacitors Cc and $V_{ss}$ capacitors Cs are arranged alternately along the entire length thereof. In FIG. 2, only one pair of capacitors Cc and Cs are shown for the sake of clarity of illustration. The substrate of the chip 11 is biased to $-3.5$ volts with a substrate bias generating circuit (not shown) composed on the chip.

Figure 3:
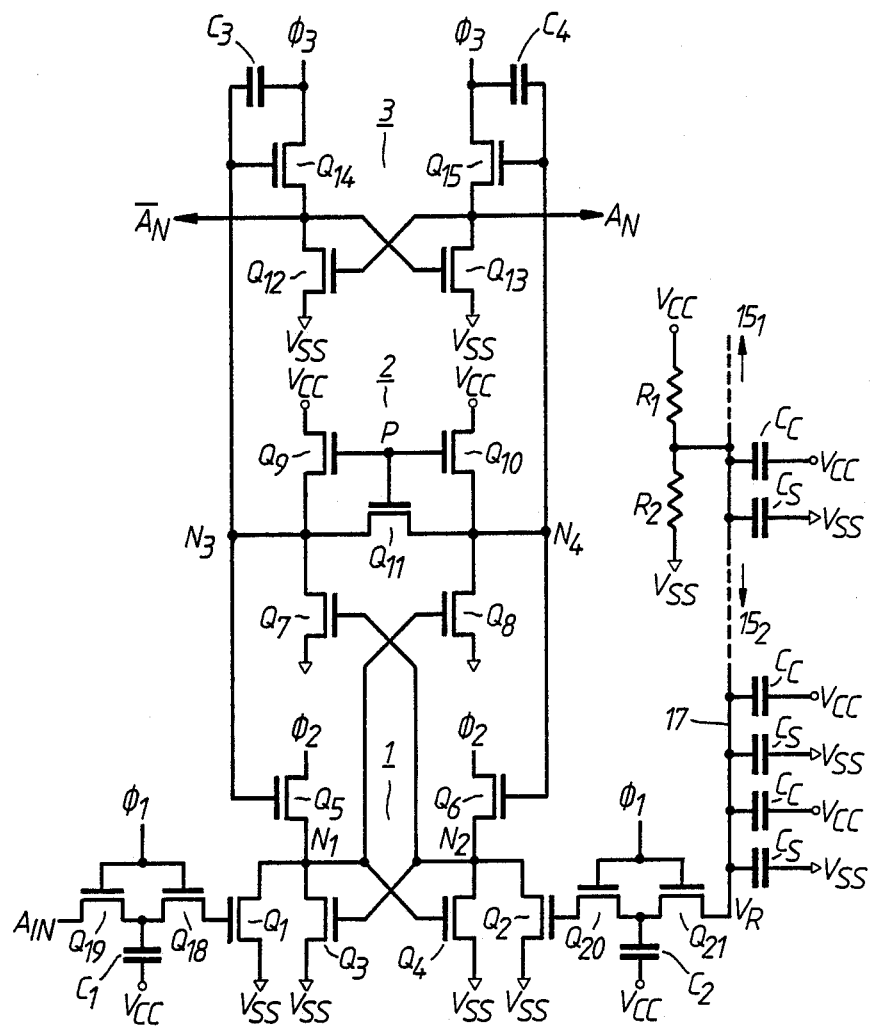
FIG. 3 is a diagram showing a circuit diagram from a standard voltage generating circuit to an address buffer circuit, corresponding to FIG. 2.

FIG. 3 is a circuit diagram showing the standard voltage generating circuit, the standard wire and one of the address buffer circuits in the address buffer region $15_2$ described in FIG. 2.

Figure 1:
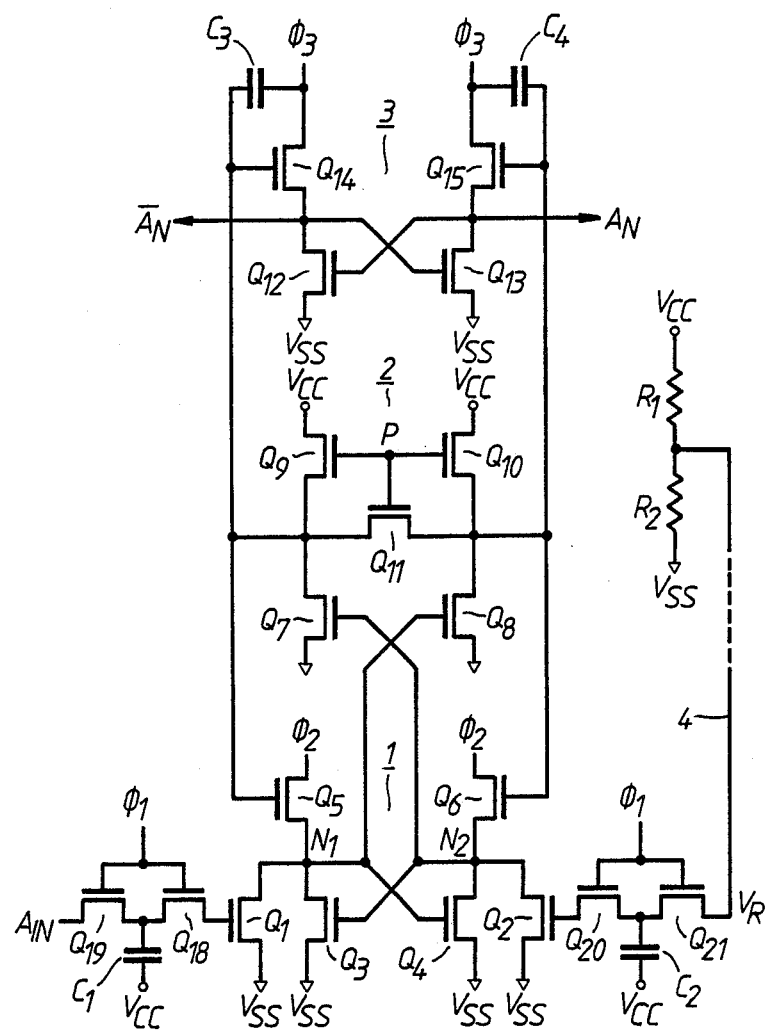
FIG. 1 is a diagram showing a circuit diagram of a conventional address buffer circuit.

The structure of the address buffer circuit itself is not changed as compared with the circuit shown in FIG. 1. That is, this address buffer circuit has a first sense MOS transistor $Q_1$ and a second sense MOS transistor $Q_2$. The first MOS transistor $Q_1$ has a gate input from address signal $A_{IN}$ and the second MOS transistor $Q_2$ has gate input from standard voltage $V_R$ of 1.6 volts. The margin (permitted variation) of $A_{IN}$ is from $-1$ to 0.8 volt for a "L" level, and from 2.4 to 6.5 volt for a "H" level. According to the difference of conductance between $Q_1$ and $Q_2$, which is brought about by input differences, the potential levels at $N_1$ and $N_2$ of flip-flop 1 consisting of MOS transistors $Q_3$ through $Q_6$, are decided. These potential differences are amplified with the first stage amplifier 2 consisting of MOS transistors $Q_7$ through $Q_{11}$, and then further amplified with the second stage amplifier 3 consisting of MOS transistors $Q_{12}$ through $Q_{15}$ and boosting capacitors $C_3$ and $C_4$. As a result, address outputs $A_N$ and $\overline{A_N}$ are obtained. MOS transistors $Q_{18}$, $Q_{19}$, $Q_{20}$ and $Q_{21}$ which are formed at the gates of sense MOS transistors $Q_1$ and $Q_2$, are transfer gates. The capacitor $C_1$ is formed for preventing under-shooting, and capacitor $C_2$ is attached for balancing.

Figure 4:
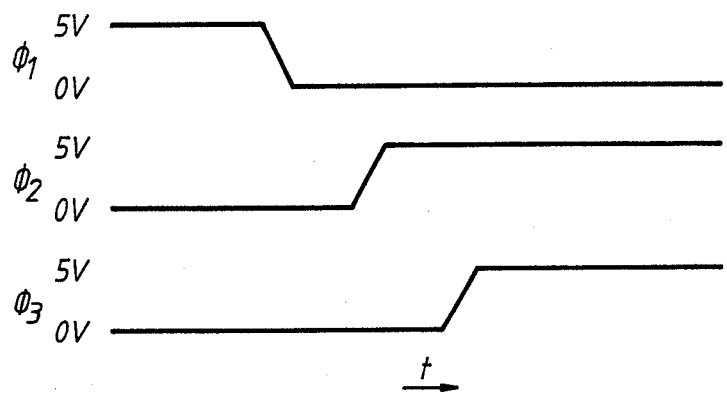
FIG. 4 is a diagram showing a timing chart of the address buffer circuit shown in FIG. 3.

FIG. 4 is a timing chart of clock phases $\phi 1$, $\phi 2$ and $\phi 3$ used in FIG. 3.

At first, the connecting terminal p of the MOS transistors $Q_9$ through $Q_{11}$ is supplied with a high voltage to preset the nodes $N_3$, $N_4$ to "H". Then, by dropping the clock $\phi 1$, $A_{IN}$ and $V_R$ are stored in the gates of the first and second MOS transistors $Q_1$ and $Q_2$, respectively. In the case $A_{IN}$ is "H", the sense MOS transistor $Q_1$ has the conductance higher than that of $Q_2$. This makes the voltage of $N_1$ lower than that of $N_2$ when the clock $\phi 2$ turns on. This voltage difference is also fed back to the gate voltages of MOS transistors $Q_5$ and $Q_6$ through the MOS transistors $Q_7$ and $Q_8$ of the first stage amplifier 2; thereby the voltage difference is amplified further. The voltage difference also exists in the nodes $N_3$ and $N_4$, and this difference is further amplified by the second stage amplifier 3. When the pulse $\phi 3$ is turned on (i.e., goes H) and the boosting capacitors $Q_3$ and $Q_4$ are operative, the high level node $N_4$ is pushed up, and the low level node $N_3$ is discharged through the MOS transistor $Q_7$. Thus, the amplified signals $A_N$ and $\overline{A_N}$ are obtained.

In FIG. 3, the standard voltage $V_R$ is obtained with the resistance division network of resistors $R_1$ and $R_2$ and voltages $V_{cc}$ and $V_{ss}$ of the standard voltage generating circuit 16. Along the standard voltage wire 17, $V_{cc}$ capacitors Cc and $V_{ss}$ capacitors Cs are connected. The capacitance of each $V_{cc}$ capacitor Cc is made equal to the capacitance of each $V_{ss}$ capacitor Cs. In FIG. 2 and FIG. 3, the number of the $V_{cc}$ capacitors Cc is made equal to that of the $V_{ss}$ capacitors Cs.

Figure 5:
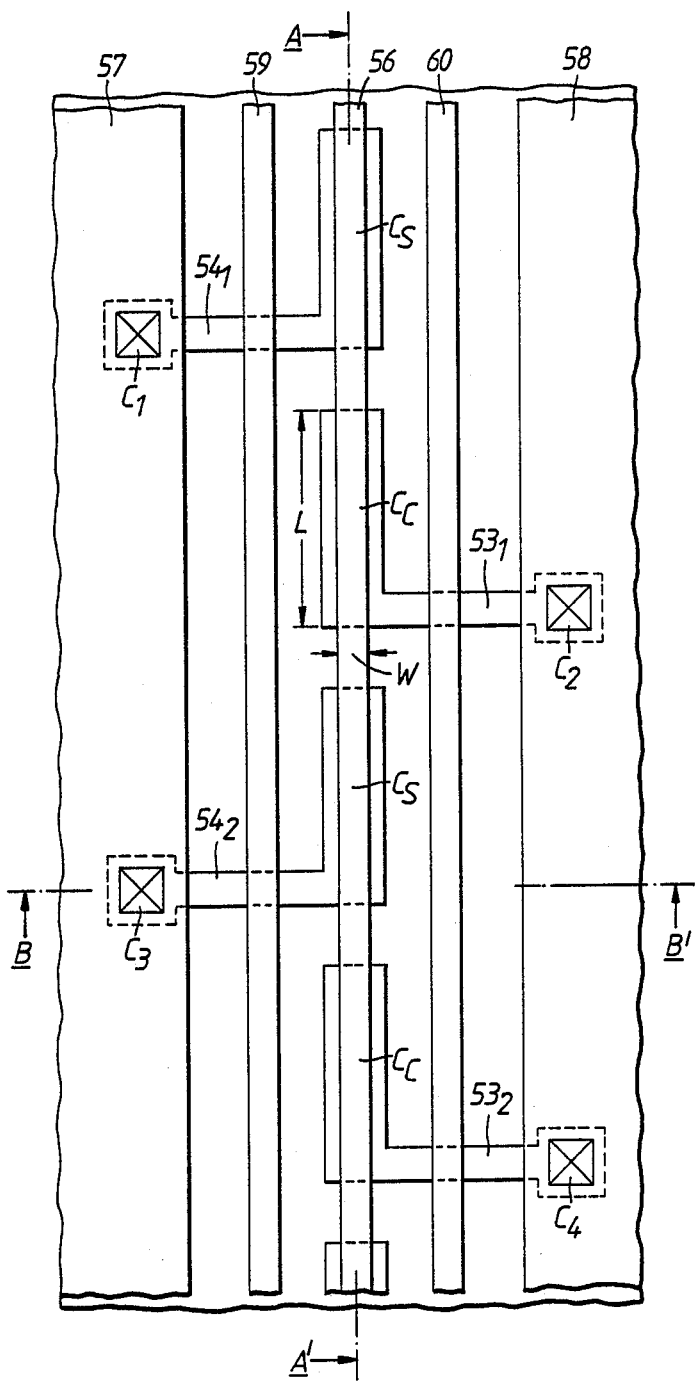
FIG. 5 is a diagram showing an enlarged plan view of a standard voltage wire and capacitors in FIG. 2.

FIG. 5 is a diagram showing an enlarged plan view of the region A shown in FIG. 2. FIG. 6a and FIG. 6b are diagrams showing the cross sectional views along the line A—A' and B—B' in FIG. 5, respectively.

On a P-type Si substrate 51, a $SiO_2$ layer 52 is formed, and $V_{cc}$ capacitor electrodes $53_1$, $53_2$ and $V_{ss}$ capacitor electrodes $54_1$, $54_2$ are stacked thereon. These capacitor electrodes $53_1$, $53_2$, $54_1$ and $54_2$ are made from the same level of a poly-Si layer, and have an L-shape. Furthermore, on these electrodes, 1 m thickness of an CVD $SiO_2$ layer 55 is formed. Contact holes $C_1$ through $C_4$ are opened in this $SiO_2$ layer 55. Onto the substrate, a standard voltage wire 56, $V_{ss}$ wire 57 and $V_{cc}$ wire 58 are arranged in parallel. Adjoining to the standard voltage wire 56, signal wires 59 and 60 are arranged. These are, for instance, clock signal wires. The wires 56 through 60 are made from the same level of an Al layer.

As shown in FIG. 5 and FIG. 6b, the $V_{cc}$ capacitor electrode $53_1$ and $53_2$ are connected with $V_{cc}$ wire 58 at the contact holes of $C_2$ and $C_4$; on the other hand, the $V_{ss}$ capacitor electrode $54_1$ and $54_2$ are connected $V_{ss}$ wire 57 at the contact holes $C_1$ and $C_3$. Hence, each of the capacitors Cc and Cs are formed along with the standard voltage wire 56, and alternately arranged. The width W of the standard voltage wire 56 is designed to be on the order of 1.2 $\mu$m, and the length L of each capacitor electrode is designed to be on the order of 50 $\mu$m. In FIG. 5, the lengthwise scale of the capacitor electrode is shown shorter than actual size for convenience of illustration.

According to this embodiment, the fluctuation of standard voltage $V_R$, which is caused by the capacitor coupling with adjoining wires such as wires 59, 60 can be greatly reduced. As the capacitance accompanying the standard voltage wire becomes large, the capacitor coupling ratio with other adjacent wires reduces, thereby reducing undesired fluctuations of $V_R$.

Further, the fluctuations of the standard voltage $V_R$ caused by fluctuations of the substrate potential, which depends on the noise of $V_{cc}$ and $V_{ss}$, is also greatly reduced. The fluctuations of the substrate potential changes the standard voltage $V_R$ because of the proximity of the voltage wire 56 to the surface of the substrate. The aforementioned reduction is attained because the capacitors Cc and Cs in this embodiment behave as shields. Moreover, the fact that the capacitance accompanying the standard voltage wire is large consequently reduces the capacitor coupling ratio with the substrate which also contributes to stabilization of the standard voltage $V_R$.

As for the noise levels of $V_{cc}$ and $V_{ss}$, the fluctuations arise with opposite phase. In this embodiment, however, capacitors of Cc and Cs are both fabricated so as to offset the influence of the capacitor adjacent thereto. Therefore, malfunction of the address buffer circuits can be prevented.

Noise levels of $V_{cc}$ and $V_{ss}$ occurs mainly when a relatively large current flows, and especially occurs at the precharging and discharging of the bit lines of the memory cell array. The connecting state of dynamic RAM chip and an outer power supply are described below in reference to FIG. 7.

Figure 7:
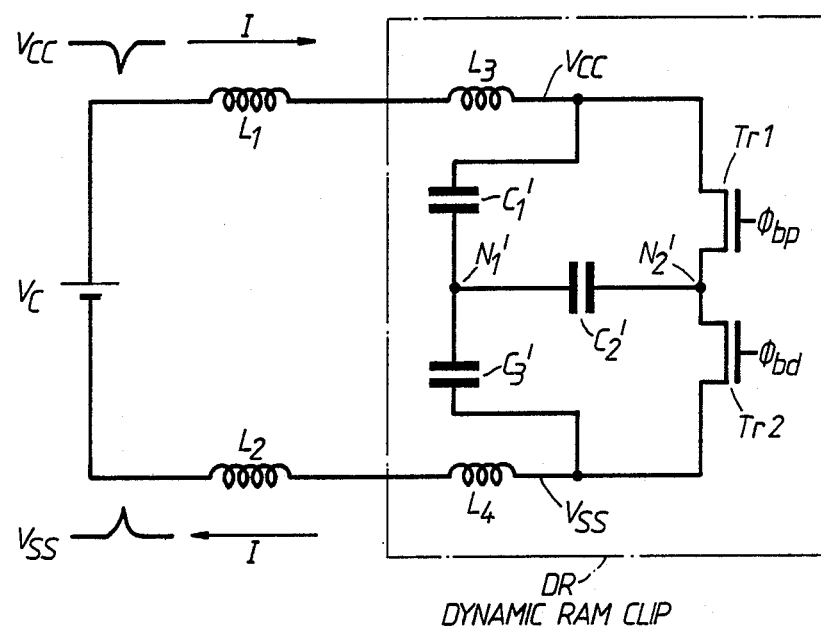
FIG. 7 is a diagram showing an equivalent circuit of a dynamic RAM chip for describing voltage fluctuations.

FIG. 7 is a diagram showing a simplified equivalent circuit of a dynamic RAM chip for describing the voltage fluctuations of $V_{cc}$ and $V_{ss}$. As shown in FIG. 7, inductances $L_1$ and $L_2$ are inherently present in the wires connecting a power supply Vc to a dynamic Ram chip DR. Further inductances $L_3$ and $L_4$ are present, respectively, in the $V_{cc}$ and $V_{ss}$ wires. The numeral $N_1'$ denotes the Si-substrate. Capacitance $C_1'$ and $C_3'$ are present between the node $N_1'$ and $V_{cc}$, $V_{ss}$ wires. Between the nodes $N_1'$ and $N_2'$, in which $N_2'$ designates bit lines, the capac-itance $C_2'$ is present. It will be understood that in the precharging period for bit lines, the capacitance $C_2'$ is charged. On the other hand, capacitance $C_2'$ is discharged in the bit line discharging period. The MOS transistor $Tr_1$ denotes the transistor for precharging, having an input pulse $\phi$bp. The MOS transistor $Tr_2$ having an input pulse $\phi$bd denotes the transistor for discharging.

When the MOS transistor $Tr_1$ turns on, charging for the bit lines begins and the current I begins to flow. A number of bit lines are charged or discharged, thereby the amount of the current has a large value.

At this time, for example in charging, the fluctuation of supply voltage $V_{cc}$ is expressed as follows:

$$V_{cc} \approx -(L_1 + L_3)\frac{dI}{dt}$$

The fluctuation of the ground voltage $V_{ss}$ is expressed as follows:

$$V_{ss} \approx (L_2 + L_4)\frac{dI}{dt}$$

The polarity in these equations is provided according to the direction of the current.

As described above, the dropping of the $V_{cc}$ level and the rising of the $V_{ss}$ level occur simultaneously.

In the embodiment described above, the $V_{cc}$ capacitors and $V_{ss}$ capacitors are arranged alternately along the standard voltage wire. Therefore, at any position, the influence of the noise of $V_{cc}$ and $V_{ss}$ can be reduced uniformly.

Figure 8:
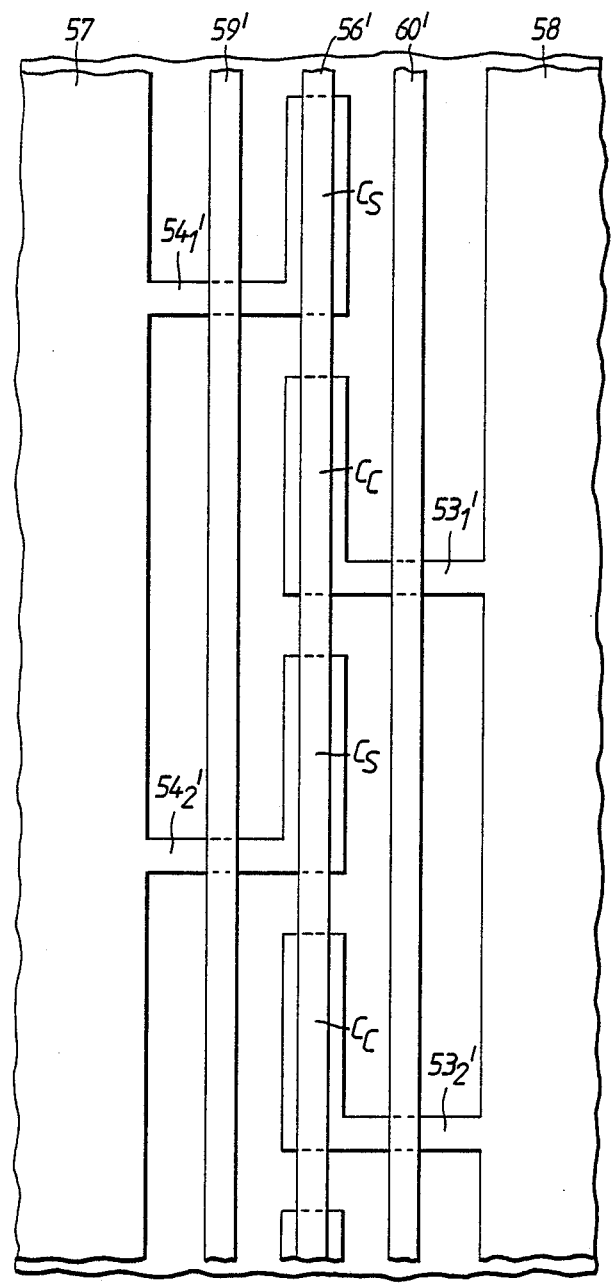
FIG. 8 is a diagram showing another embodiment of a standard voltage wire and its capacitors.

FIG. 8 is a diagram showing another embodiment of the standard voltage wire and its capacitors. The same numerals are used in this figure as for corresponding parts in FIG. 5.

In this embodiment, the $V_{cc}$ capacitor electrodes $53_1'$, $53_2'$ and $V_{ss}$ capacitor electrodes $54_1'$, $54_2'$ are formed in one body respectively adjacent and contacting the $V_{cc}$ wire 58 and the $V_{ss}$ wire 57 and are all made from a first Al layer. The standard voltage wire 56' and signal wires 59', 60' are made from a second Al layer. Between the first and second Al layers, a CVD $SiO_2$ layer of 1.4 μm thickness is formed.

Figure 9:
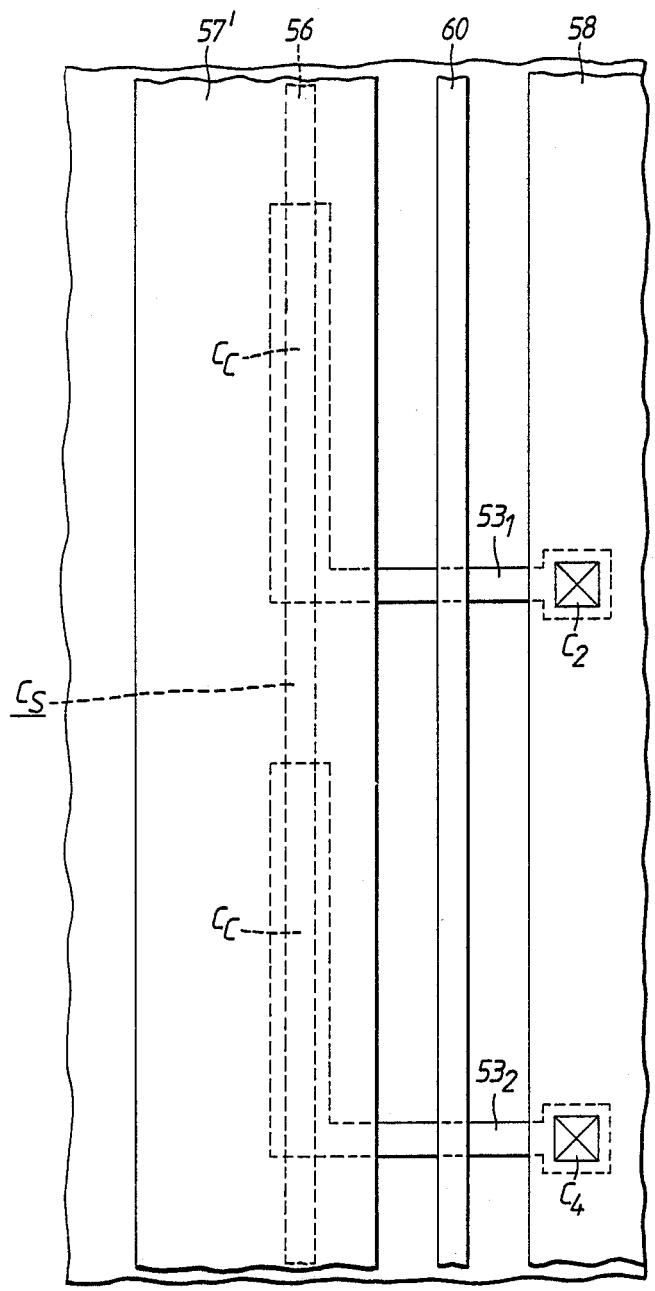
FIG. 9 is a diagram showing still another embodiment of a standard voltage wire and its capacitors.

FIG. 9 is a diagram showing another embodiment of the standard voltage wire and its capacitors. In this embodiment, the standard voltage wire 56, the signal wire 60 and the $V_{cc}$ wire 58 are made from a first Al layer. The $V_{cc}$ capacitor electrodes $53_1$ and $53_2$ are both made from the same level layer of poly-Si as in FIG. 5. The $V_{ss}$ wire 57' of a second Al layer overlaps the standard voltage wire 56, and forms a $V_{ss}$ capacitor on the entire upper surface of the standard voltage wire 56. The thickness of the CVD $SiO_2$ layer formed between the first and second Al layers is 1.4 μm, which is thicker than that of the layer between the poly-Si layer and the first Al layer of 1 μm, thereby gaps remain between each $V_{cc}$ capacitor electrode of $53_1$ and $53_2$ for equalizing the value of both capacitors. It will be obvious that the relation between $V_{cc}$ and $V_{ss}$ may be reversed to that shown in FIG. 9.

The invention is not restricted to the embodiments described above. For instance, in the embodiments shown, the standard voltage generating circuit is positioned between the address buffer regions, however, it is possible to extend a standard voltage wire from the standard voltage generating circuit and supply the standard voltage to the address buffer regions by one standard voltage wire, such as by means of moving the standard voltage generating circuit to the left bottom corner in FIG. 2.

Furthermore, in the embodiments, the address buffer circuit region of the dynamic RAM is applied. However, the present invention can be applied to other sense circuit regions that perform the sense action by a similar principle using a standard voltage having a medium level between "H" and "L" levels of the input signal. For instance, data input buffer circuits may be applied. Furthermore, the invention is not restricted to a specific sense circuit region, for example, in the case for setting the cell plate electrode (common memory capacitor electrode) of a MOS dynamic RAM to a medium voltage, it is effective to arrange the $V_{cc}$ and $V_{ss}$ capacitor along the standard voltage wire connecting the cell plate to the standard voltage generating circuit which generates the voltage between the supply voltage $V_{cc}$ and the ground voltage $V_{ss}$, similar to the embodiment described above. This formation can be effective to prevent potential fluctuations of the cell plate.

In the embodiments described above, it is preferable to set the length of each $V_{cc}$ and $V_{ss}$ capacitor along the standard voltage wire to at least five times longer than the width of the standard voltage wire, and particularly to at least twenty times longer than the width of the standard voltage wire.

Other modifications and improvements of the invention will also become apparent to those skilled in the art, and the invention is intended to cover such modifications and improvements as defined by the appended claims.

What is claimed is:

1. A semiconductor integrated circuit, comprising:
   a semiconductor integrated circuit chip;
   standard voltage generating means for generating a standard voltage other than a supply voltage and a ground voltage, said standard voltage generating means formed in said semiconductor integrated circuit chip;
   at least one standard voltage wire connected to said standard voltage generating means for supplying said standard voltage to at least one circuit of said semiconductor integrated circuit chip;
   at least one first capacitor extending along said standard voltage wire, said first capacitor having said standard voltage wire as one electrode thereof, and the other electrode thereof being connected to said supply voltage; and
   at least one second capacitor extending along said standard voltage wire, said second capacitor having said standard voltage wire as one electrode thereof, and the other electrode thereof being connected to said ground voltage.

2. A semiconductor integrated circuit according to claim 1, further comprising,
   a supply voltage wire; and
   a ground voltage wire;
   wherein, at least one of said other electrodes of said first and second capacitor is connected to the corresponding wire of one of said supply voltage wire and said ground voltage wire.

3. A semiconductor integrated circuit according to claim 2, wherein said connected electrode has a capacitor portion and a connection portion, said connection portion having a width smaller than the length of said capacitor portion.

4. A semiconductor integrated circuit according to claim 2, wherein said connected electrode is made from a conductive layer of different levels in said chip as compared with that of the corresponding wire of one of said supply voltage wire and said ground voltage wire to which said connected electrode is connected, and said connected electrode is connected to said corresponding wire via a contact hole.

5. A semiconductor integrated circuit according to claim 2, wherein said connected electrode and said corresponding wire to which said connected electrode is connected are made from a conductive layer of the same level of said chip.

6. A semiconductor integrated circuit according to claim 2, wherein the other electrode of said first capacitor is connected to said supply voltage wire, and the other electrode of said second capacitor is connected to said ground voltage wire.

7. A semiconductor integrated circuit according to claim 1, wherein at least one of said other electrodes of said first and second capacitors is positioned below the bottom surface of said standard voltage wire.

8. A semiconductor integrated circuit according to claim 7, wherein both of said other electrodes of said first capacitor and said second capacitor are positioned below the bottom surface of said standard voltage wire.

9. A semiconductor integrated circuit according to claim 1, further comprising:
   a supply voltage wire; and
   a ground voltage wire;
   wherein, one of said supply voltage wire and ground voltage wire overlaps said standard voltage wire, and forms one of said first capacitor and second capacitor.

10. A semiconductor integrated circuit according to claim 1, further comprising:
    a supply voltage wire;
    a ground voltage wire; and
    a plurality of capacitor electrodes;
    wherein, one of said supply voltage wire and ground voltage wire overlaps said standard voltage wire and forms one of said first capacitor and second capacitor, and said plurality of capacitor electrodes consist of said other electrodes of said first and second capacitor, and are connected to said supply voltage wire and said ground voltage wire.

11. A semiconductor integrated circuit according to claim 1, further comprising at least one signal wire, said signal wire adjoining said standard voltage wire.

12. A semiconductor integrated circuit according to claim 3, further comprising at least one signal wire, said signal wire crossing said connection portion and running along said standard voltage wire.

13. A semiconductor integrated circuit according to claim 1, wherein said standard voltage wire supplies said standard voltage to a plurality of said circuits of said semiconductor integrated circuit chip.

14. A semiconductor integrated circuit according to claim 1, wherein said at least one circuit is a sense circuit, and is supplied by said standard voltage with a voltage level between said supply voltage and said ground voltage.

15. A semiconductor integrated circuit according to claim 1, wherein said semiconductor integrated circuit chip is a dynamic RAM chip.

16. A semiconductor integrated circuit according to claim 1, wherein said first capacitor and said second capacitor are arranged alternately in said chip.

17. A semiconductor integrated circuit according to claim 1, wherein said first capacitor and said second capacitor are arranged uniformly along said standard voltage wire.

18. A semiconductor integrated circuit according to claim 1, wherein a plurality of first and second capacitors are arranged along said standard voltage wire, and the gap formed between each of said capacitors is smaller than the length of each capacitor.

19. A semiconductor integrated circuit according to claim 1, wherein the length of each of said first capacitor and second capacitor is at least five times longer than the width of said standard voltage wire.

20. A semiconductor integrated circuit according to claim 1, wherein the length of each of said first capacitor and second capacitor is at least twenty times longer than the width of said standard voltage wire.

21. A semiconductor integrated circuit according to claim 1, wherein the capacitance of said first capacitor and the capacitance of said second capacitor are approximately equal.

* * * * *